United States Patent [19]

Uya

[11] Patent Number: 4,645,944
[45] Date of Patent: Feb. 24, 1987

[54] MOS REGISTER FOR SELECTING AMONG VARIOUS DATA INPUTS

[75] Inventor: Masaru Uya, Hirakata, Japan

[73] Assignee: Matsushita Electric Industrial Co., Ltd., Kadoma, Japan

[21] Appl. No.: 647,016

[22] Filed: Sep. 4, 1984

[30] Foreign Application Priority Data

Sep. 5, 1983 [JP] Japan ................ 58-163504

[51] Int. Cl.[4] .......................... H03K 17/693
[52] U.S. Cl. ...................... 307/243; 307/443; 307/451; 307/279
[58] Field of Search ........... 307/443, 448, 451–452, 307/354, 360, 361–364, 243, 279, 291; 328/104, 206; 365/156, 181, 182; 370/112

[56] References Cited

U.S. PATENT DOCUMENTS

| | | | |
|---|---|---|---|
| 4,390,987 | 6/1983 | Best | 307/243 X |
| 4,447,892 | 5/1984 | Zibu | 365/156 |
| 4,463,273 | 7/1984 | Dingwall | 307/279 X |
| 4,558,237 | 12/1985 | Rabe et al. | 307/279 X |
| 4,559,608 | 12/1985 | Young et al. | 307/279 X |
| 4,563,594 | 1/1986 | Koyama | 307/279 X |

OTHER PUBLICATIONS

Pomerantz, "Complementary MOS J-K Flip-Flop and Shift Cell", *IBM T.D.B.*, vol. 16, No. 11, Apr. 1974, pp. 3613-3614.

Primary Examiner—John S. Heyman
Assistant Examiner—D. R. Hudspeth
Attorney, Agent, or Firm—Cushman, Darby & Cushman

[57] ABSTRACT

In a high speed latching circuit (C) for selectively receiving one or plural slowly changing input data signals and latching them at high speed, one or plural first CMOS FETs (31, 33, 35, 37) and one or plural second CMOS FETs (32, 34, 36, 38) of p-conductivity type are connected in series respectively to form one or plural series connections (31+32, 33+34, 35+36, 37+38), wherein selection signals are given to the gates of the first CMOS FETs, input data signals are given to the gates of the second CMOS FETs and a flip-flop (30+39+41) is driven by selected one of the series connections.

7 Claims, 5 Drawing Figures

MOS REGISTER FOR SELECTING AMONG VARIOUS DATA INPUTS

BACKGROUND OF THE INVENTION

The present invention relates generally to a MOS transistor circuit, and particularly to the MOS transistor circuit for use as input register of an ALU (arithmetic logic unit) of a micro-processor. The input register is for holding a signal of one selected bus among signals of plural internal bus lines and outputs to feed to the ALU. FIG. 1 shows a conventional configuration of input register A and related circuits, and FIG. 2 shows wave forms of various parts of FIG. 1. Data bus lines $DB_0$, $DB_1$, $DB_2$ and $DB_3$ are each for bit data bus, and signals thereon are designated as b, c, d and e, respectively.

The circuit part A is the part that which is improved by the present invention, wherein a known complex gate constituted by plural CMOS logic gates operates in such a manner that any one of the signals b, c, d and e selectively issued as inverted output signal K responding to selection signal $\overline{SEL}_0$, $\overline{SEL}_1$, $\overline{SEL}_2$ or $\overline{SEL}_3$ being at L level. That is, the complex gate 13 operates as a data selector. A block B is a known data latch, in which when enable (ENB) signal j is at a high level (hereinafter is referred as H level) input signal k is inverted and issued as output signal 1 at its data output signal terminal DATA. When ENB signal j is at L-level, it latches input signal k at the input terminal at the time of transition of the signal j from H-level to L-level. The circuit comprises p channel FETs 16, 17, 18 and 19 and n channel FETs 20, 21, 22 and 23. Four p channel FETs 1, 2, 3 and 4 are provided for precharging data bus lines $DB_0$, $DB_1$, $DB_2$ and $DB_3$, respectively, and the data bus lines are precharged to power supply voltage $V_{DD}$ when precharge signal $\overline{PCH}$ is applied to the gates of the p channel transistors 1, 2, 3 and 4. The data bus lines $DB_0$, $DB_1$, $DB_2$ and $DB_3$ have load capacitances 5, 6, 7 and 8, respectively. Registers 9, 10, 11 and 12 are connected by their output terminals to the data bus lines $DB_0$, $DB_1$, $DB_2$ and $DB_3$, respectively, and are each constituted the same as each other, each having an n channel transistor 90 whose drain is connected to the bus line. The output terminal DATA of the input register A is connected to an input terminal of subsequently connected (not shown) ALU (arithmetic logic unit).

Operation of the conventional circuit configuration shown in FIG. 1 is elucidated. As shown in FIG. 2, the circuits of micro-processor including the data bus lines $DB_0$, $DB_1$, $DB_2$ and $DB_3$ and the ALU (not shown) are working in synchronism with clock signals of four phases T1, T2, T3 and T4. Firstly, at the timings of T1 and T3, valid data are impressed on data bus lines $DB_0$, $DB_1$, $DB_2$ and $DB_3$, and the prechargings of the data bus lines are carried out in the timings T2 and T4 as shown in curve a of FIG. 2 whereon the precharge signal $\overline{PCH}$ is at L level at T2 and T4. And, the timing when the subsequent ALU comes into processing operation is the timing of T4. That is, the input register A selectively reads either one of the data bus signal b, c, d or e at the timing of T3, and the read-in signal should be fed to the ALU as soon as possible.

As shown by wave forms f, g, h, i and j of FIG. 2, the selection signals $\overline{SEL}_0$ through $\overline{SEL}_3$ and enable signal ENB are fed at the timing of beginning part of the time T3. Accordingly at the beginning part of T3, output transistors of the registers 10 and 12 becomes ON, and accordingly data signal "H", "L", "H" and "L" are impressed on the data bus lines $DB_0$, $DB_1$, $DB_2$ and $DB_3$, respectively. Since these data bus lines $DB_0$ through $DB_3$ have load capacitance 5, 6, 7 and 8, transitions from H-level (voltage $V_{DD}$ of power supply) to L level (ground level) take some finite time, that is the level does not decrease rapidly enough. Accordingly, rising of signal on the bus $DB_1$ selected by the signal $\overline{SEL}_1$ from L-level to $V_{DD}/2$ ($\approx 5V/2 = 2.5$ V) which is the circuit threshold voltage of the CMOS complex gates requires a propagation delay $t_1$ as shown in curve form c of FIG. 2. Therefore, from the time of entering the time phase T3 to the transistion of the L-signal of data bus $DB_1$ to output terminal DATA of the input register A takes a considerable time $t_4$. Therefore, the arrival of the signal to the subsequent ALU (not shown) from the data bus is considerably delayed. Furthermore, the input register A comprises 16 transistors in complex gate 13 and 12 transistors in data latch part B, that is 28 transistors in total in the input register A. This number of transistors in this circuit only represents a single bit data latching. As a conclusion, there are too many transistors comprised in the input register A. For instance, in a case of an input register for a 16-bit ALU, where the input register must latch 32-bit data, the number of transistors to be contained in the input register becomes such a large number as 896 ($=28 \times 32$) and they occupy a large area on the integrated circuit. Therefore, a more simply configured input register has been envisaged.

SUMMARY OF THE INVENTION

The purpose of the present invention is to provide a novel MOS transistor circuit, wherein the above-mentioned shortcomings, that is, delay of signal transmission in the input register part and necessity of a large area on the IC or LSI by the input register part can be drastically improved, and hence is very much advantageous in utilizing as data register for selecting and latching signals on data bus in a MOS transistor circuit, such as for a micro-processor.

The MOS transistor circuit in accordance with the present invention is configured in a manner that a first MOS transistor of a first conductivity type and a second MOS transistor of a first conductivity type are connected in series each other by connecting the drain of the first MOS transistor to the source of the second MOS transistor thereby constituting a series connection, and the source of the first MOS transistor is connected to a first constant voltage point and the drain of the second MOS transistor is connected to a common connection point, a third MOS transistor is connected by the drain to the common connection point, by the source to a second constant voltage point and by the gate to the preset signal line, at least one above-mentioned series connections respectively for selection signals are further connected parallelly across the first constant voltage point and the common connection point, respective gates of the first MOS transistors are connected to respective selection signal input terminals and respective gates of the second MOS transistors are connected to respective data input terminals, a first inverter is connected by its input terminal to the common connection point q and by its output terminal to an external output terminal, and a second inverter is connected by its input terminal to the output terminal of the first inverter and by its output terminal to the input terminal of the first inverter, then, by applying a selection signal to the gate of a selected series connection, data signal on the selected bus line is selectively read in and latched at the external output terminal.

The circuit can transmit the selected and latched data at a very fast speed even when the input signal slowly transit from H-level to L-level or vise versa, and furthermore the circuit configuration necessitates smaller number of MOS transistors in comparison with the conventional circuit.

DETAILED DESCRIPTION OF THE PREFERRED EMBODIMENT

Figure 1:
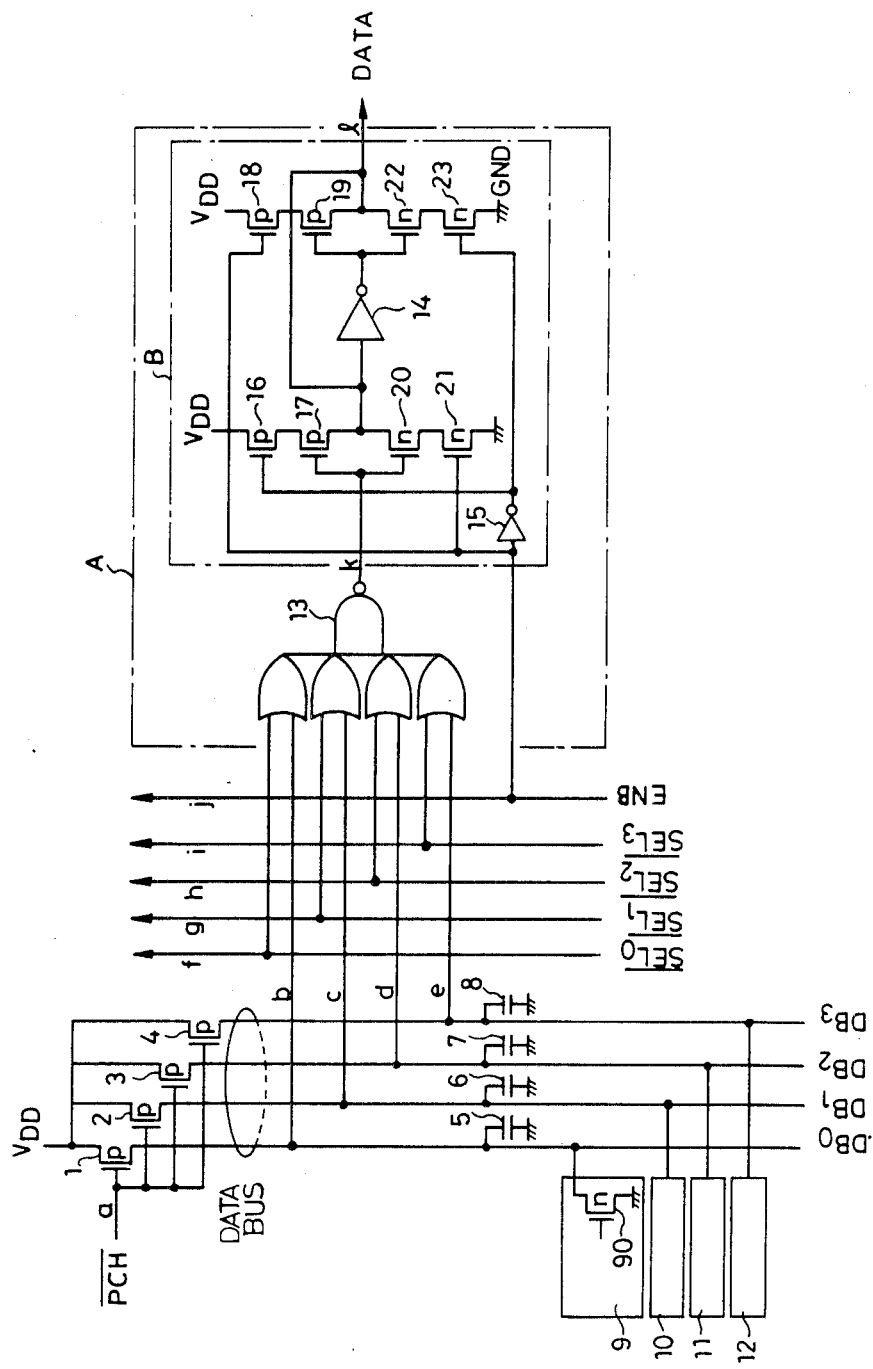
FIG. 1 is the circuit diagram of the conventional configuration of input register and related circuits.

A preferred embodiment of the present invention is described with reference to FIG. 3, wherein a circuit for performing the function of the circuit of FIG. 1 in, but having a better performance, is shown. The circuit is for reading a data signal in on one selected bus line of plural bus lines $DB_0$, $DB_1$, $DB_2$ and $DB_3$, latching and issuing it to the external output terminal DATA. The external output terminal DATA is connected to the input terminal of an ALU (arithmetic logic unit; not shown in the drawing). That is, similar to the conventional part of FIG. 1, a circuit C encircled by chain lines functions as a one bit circuit for the input register of the ALU.

The components and circuit parts designated by the references 1-12 and 90, $DB_0$ through $DB_3$, $\overline{SEL_0}$ through $\overline{SEL_3}$ and $\overline{PCH}$, and signals a through i correspond to the same references used in the circuit of FIG. 1, and represent the corresponding components, parts and signals. Each of data bus lines $DB_0$, $DB_1$, $DB_2$ and $DB_3$ is a four bit data bus, and signals thereon are designated as b, c, d and e, respectively. A circuit part C is the part that which has been improved in the present invention. In the circuit part C, four p channel FETs 1, 2, 3 and 4 are provided for precharging data bus lines $DB_0$, $DB_1$, $DB_2$ and $DB_3$, respectively, and the data bus lines are precharged to power source voltage $V_{DD}$ when precharge signal $\overline{PCH}$ is impressed on the gate of either one of p channel MOS transistor 1, 2, 3 or 4. The data bus lines $DB_0$, $DB_1$, $DB_2$ and $DB_3$ have load capacitances 5, 6, 7 and 8, respectively. Registers 9, 10, 11 and 12 are connected by their output terminals to the data bus lines $DB_0$, $DB_1$, $DB_2$ and $DB_3$, respectively, and are constituted the same as each other, and each has an n channel transistor 90 connected by the drain to the bus line. The external output terminal DATA of the circuit part C is connected to an input terminal of subsequently connected (not shown) ALU. In FIG. 3, MOS transistors 31, 33, 35 and 37 are commonly connected by their source to a power source terminal $V_{DD}$, a first constant potential point. The gates of these transistors are respectively connected to selection signal lines $\overline{SEL_0}$, $\overline{SEL_1}$, $\overline{SEL_2}$ and $\overline{SEL_3}$. The drains are connected to the sources of the MOS transistors 32, 34, 36 and 38, respectively. The MOS transistors 32, 34, 36 and 38 have their gates connected to the bus lines $DB_0$, $DB_1$, $DB_2$ and $DB_3$, respectively, and their drains commonly connected to a common connection point q. The source of an n channel transistor 40 is connected to the common connection point q, the drain to ground GND and the gate to the preset signal line PRES. Another n channel MOS transistor 41 is face to face connected to transistor 40 with its source connected to the common connection point q, and its drain to ground GND. The gate of transistor 41 is connected to the external output terminal DATA. An inverter 30 constituted by CMOS transistors is connected by its input terminal to the common connection point q and by its output terminal to the external output terminal DATA. A p-type MOS transistor 39 is connected by the source to the power source terminal $V_{DD}$, by the drain to the common connection point q and by the gate to the external output terminal DATA. The p channel transistor and the n channel transistor 41 together constitute a second inverter; and the first inverter 30 and the second inverter together constitute a flip-flop. In an embodiment where only one data bus line is provided, only one series connection of the first transistor 31 and the second transistor 32 is provided. The characteristics of the p channel MOS transistor 39 and the n channel MOS transistor 40 are selected such that ON-resistance of the p channel transistor 39 is sufficiently larger than ON-resistance of the n channel MOS transistor 40. By such configuration, it is possible to fulfill the condition that, provided that the circuit threshold voltage of the inverter 30 is $V_{THC}$ (which is said 1.5-2.5 V in this embodiment), when both MOS transistors 39 and 40 are turned ON at the same time, the input voltage of the inverter 30 (signal n) can be made lower than the circuit threshold voltage $V_{THC}$.

Furthermore, in each series connection of the first MOS transistor and the second MOS transistor, the characteristics of the p channel MOS transistors are selected such that in either series connection 31+32, 33+34, 35+36 or 37+38, the composite ON-resistance of the series connection is sufficiently smaller than the ON-resistance of the n channel MOS transistor 41. By such configuration, it becomes possible to fulfill a condition that, even when either one of the series connection and the n channel transistor 41 are in ON-states at the same time, the input voltage of the inverter 30 is higher than the circuit threshold voltage $V_{THC}$. In the embodiment, all the p channel transistors 31 through 38 are designed to have the same ON-resistance. Furthermore, the MOS transistors 39 and 41 are transistors having relatively small trans conductance.

The preset signal line PRES is used for feeding a preset signal m to the gate of the MOS transistor 40, which is for forcingly grounding an input signal to be given to the input terminal of the inverter 30.

Figure 3:
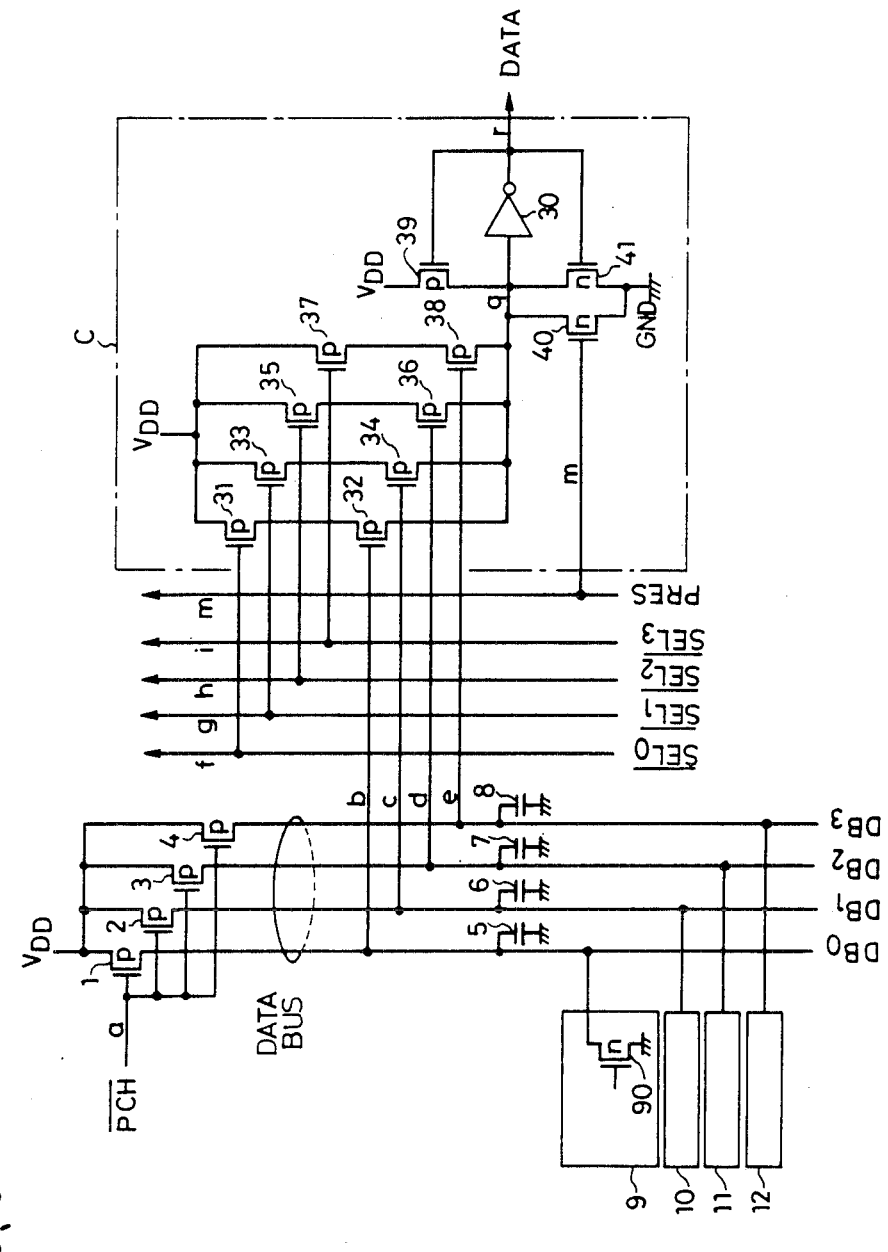
FIG. 3 is a circuit diagram of an input register and related circuit in accordance with the present invention.

Now, the operation of the circuit of FIG. 3 is described in detail with reference to the time chart of FIG. 4, wherein waveforms a, b, c, d, e, f, g, h, i, m, q and r show signal waveforms of signals of various parts. As shown by waveforms f, g, h, i and j of FIG. 4, the selection signals $\overline{SEL_0}$ through $\overline{SEL_3}$ and enable signal ENB are fed at the timing of beginning part of the time phase T3. Acoordingly at the beginning part of T3, output transistors of the registers 10 and 12 turn ON, and accordingly data signals "H", "L", "H" and "L" are impressed on the data bus lines $DB_0$, $DB_1$, $DB_2$ and $DB_3$, respectively.

Figure 4:
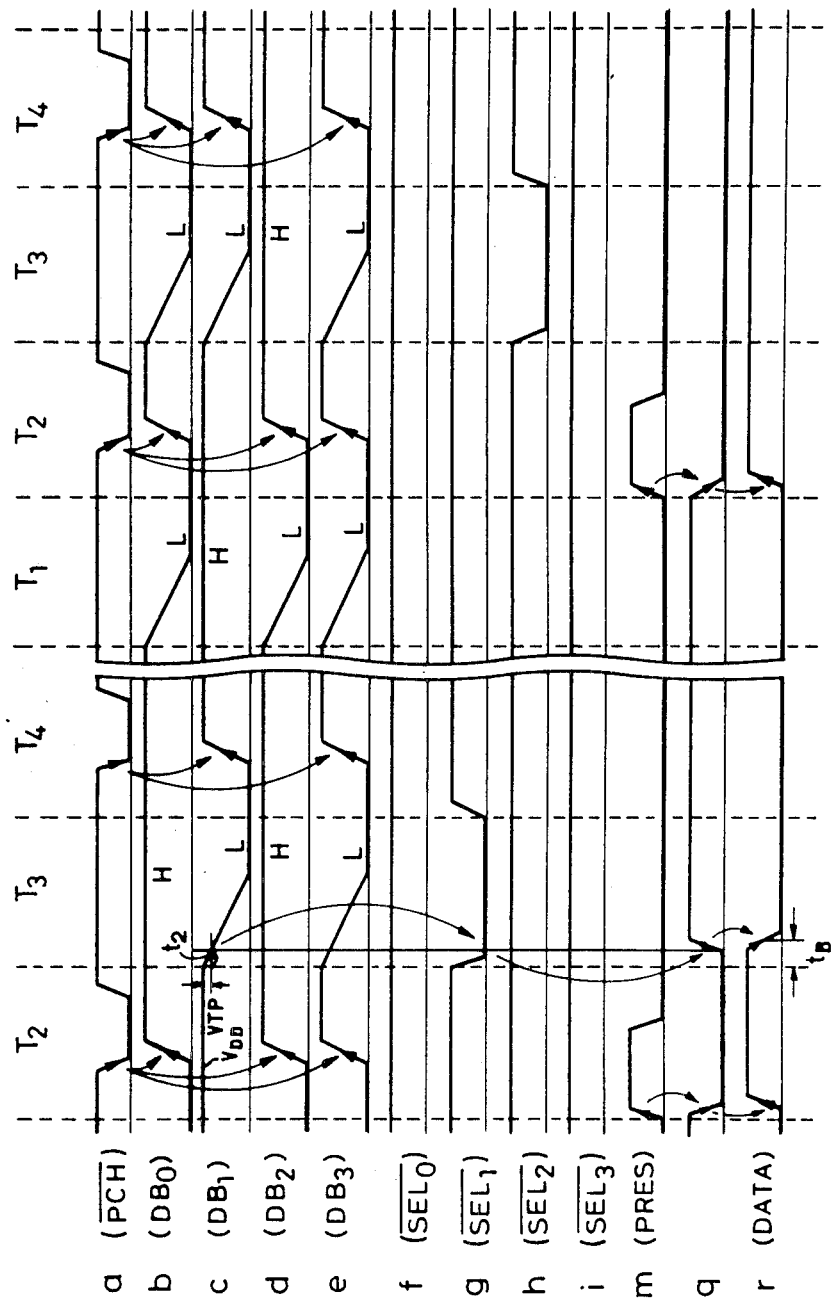
FIG. 4 is a time chart showing waveforms of various parts of FIG. 3.

The left half part of FIG. 4 shows time phases $T_2-T_4$ of a first kind of cycle. In this first kind of cycle, data b, c, d and e on the data bus lines $DB_0$, $DB_1$, $DB_2$ and $DB_3$ at L level is read in and latched. The right half part of FIG. 4 shows a second kind cycle consisting of $T_1-T_4$ wherein H-level of the data b, c, d and e on the data bus lines $DB_0$, $DB_1$, $DB_2$ and $DB_3$ are read in and latched.

[Operation to read and latch L signal on data bus]

As shown by waveform m of FIG. 4, the preset signal PRES is fed during the phase of $T_2$, turing the n channel MOS transistor 40 on. Input signal n of the inverter 30 thus becomes L-level. Then, as shown by the waveform r of FIG. 4, the output signal of inverter 30 turns to a "H"-level in the time phase of $T_2$ at the external output terminal DATA.

When during the time phase $T_3$ of the first kind of cycle (left half side of FIG. 4) only the selection signal $\overline{SEL}_1$ to select the data bus $DB_1$ transits to the L level, only the p channel MOS transistor 33 among the p channel MOS transistors 31 through 38 turns on.

Then, for instance, data c and e of the data bus $DB_1$ and $DB_3$ may turn to L-signal, and the level of an the data bus lines $DB_1$ and $DB_3$ gently fall from the "H"-level, i.e., the power source voltage $V_{DD}$ to L level i.e., the ground voltage. At this time, though the p channel MOS transistor 38, to the gate of which the data of the data bus line $DB_3$ is applied, is liable to become ON-state. But as a result of OFF state of the series connected p channel MOS transistor 37, this series connection does not have any effect on the input signal q of the inverter 30. Hereupon, the source of the p channel MOS transistor 34, to which the data of the data bus line $DB_1$ is given, is almost at the power source voltage $V_{DD}$, since the p channel MOS transistor 33 is ON. At the time when the data signal c on the data bus line $DB_1$ falls from the voltage $V_{DD}$ to a voltage $V_{DD}-V_{TP}$, where $V_{TP}$ is threshold voltage of the p channel MOS transistor, after a lapse of a short time $t_2$ from the start of falling of the data signal c, the transistor 34 turns on and the input terminal q of the inverter 30 rapidly rises from the ground voltage to $V_{DD}$ (H), the "H"-level is inverted by the inverter 30, an "L"-level signal is issued to the external output terminal DATA and this output is retained. Let us label the time period from the beginning of the $T_3$ phase to the time when "L"-level signal is issued at the output terminal DATA as $t_B$. This time period $t_B$ is not long due to the below mentioned reason, irrespective of gradual transitting of the data bus signal. Accordingly, quick selection and latching of the data bus signal and issuing to subsequent stage becomes possible.

[Operation to read and latch "H"-signal on data bus]

The right half part of FIG. 4 shows the second cycle operation where "H"-signal on the data bus is read in and latched is described. In this case, at the time phase $T_2$ the output terminal DATA is already preset to a "H"-level by means of the preset signal $\overline{PRES}$. And in the time phase $T_3$, only the selection signal $\overline{SEL}_2$ is set at a "L" level, and hence the data bus line $DB_2$ is selected. At this time, the signal d of the data bus line $DB_2$ is "H" (namely at the voltage of $V_{DD}$), and accordingly the p channel MOS transistors 35 and 36 are in ON and OFF-states, respectively. Therefore, the input terminal q of the inverter 30 does not receive any influence. Accordingly, when the operation comes to the $T_3$ phase in the right side of FIG. 4, the H-level of the output terminal DATA is retained as it is.

Apart from the above-mentioned embodiment of FIG. 3, when data bus signals, which are input signals, are precharged at the side of the voltage $V_{DD}$, an alternative embodiment with the data signal to be precharged at the side of ground voltage may be equally realizeable. Such alternative embodiment can be realized by transforming all the p channel MOS transistors into n channel MOS transistors and on the other hand all the n channel MOS transistors into p channel MOS transistors, and voltages $V_{DD}$ and GND are interchanged. Such embodiment is shown in FIG. 5, and the operation is substantially the same as the previous embodiment of FIG. 3.

Figure 5:
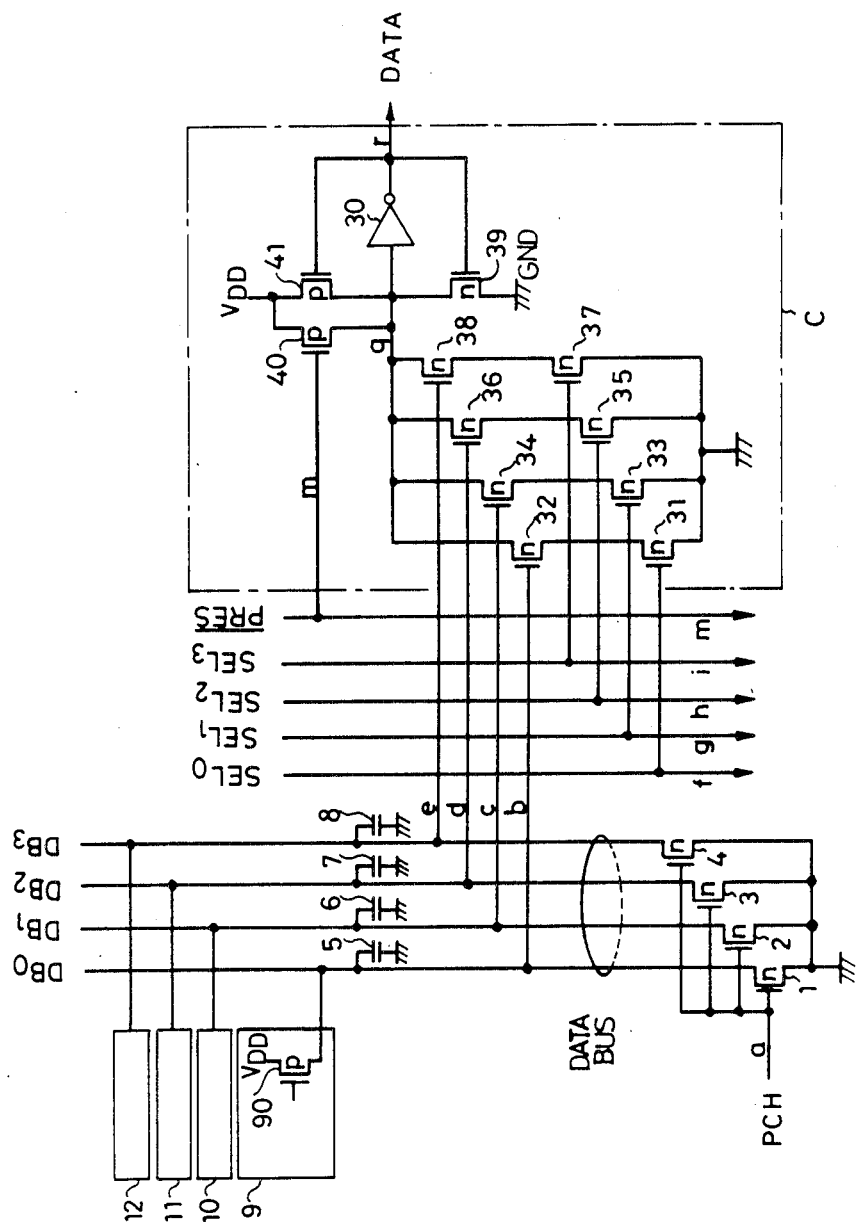
FIG. 5 is a circuit diagram of a modified embodiment in accordance with the present invention.

The technical advantages of the MOS transistor circuit in accordance with the present invention described with reference to the embodiment shown in FIG. 3 through FIG. 5 are described as follows in contrast to the prior art apparatus shown in FIG. 1 and FIG. 2.

Figure 2:
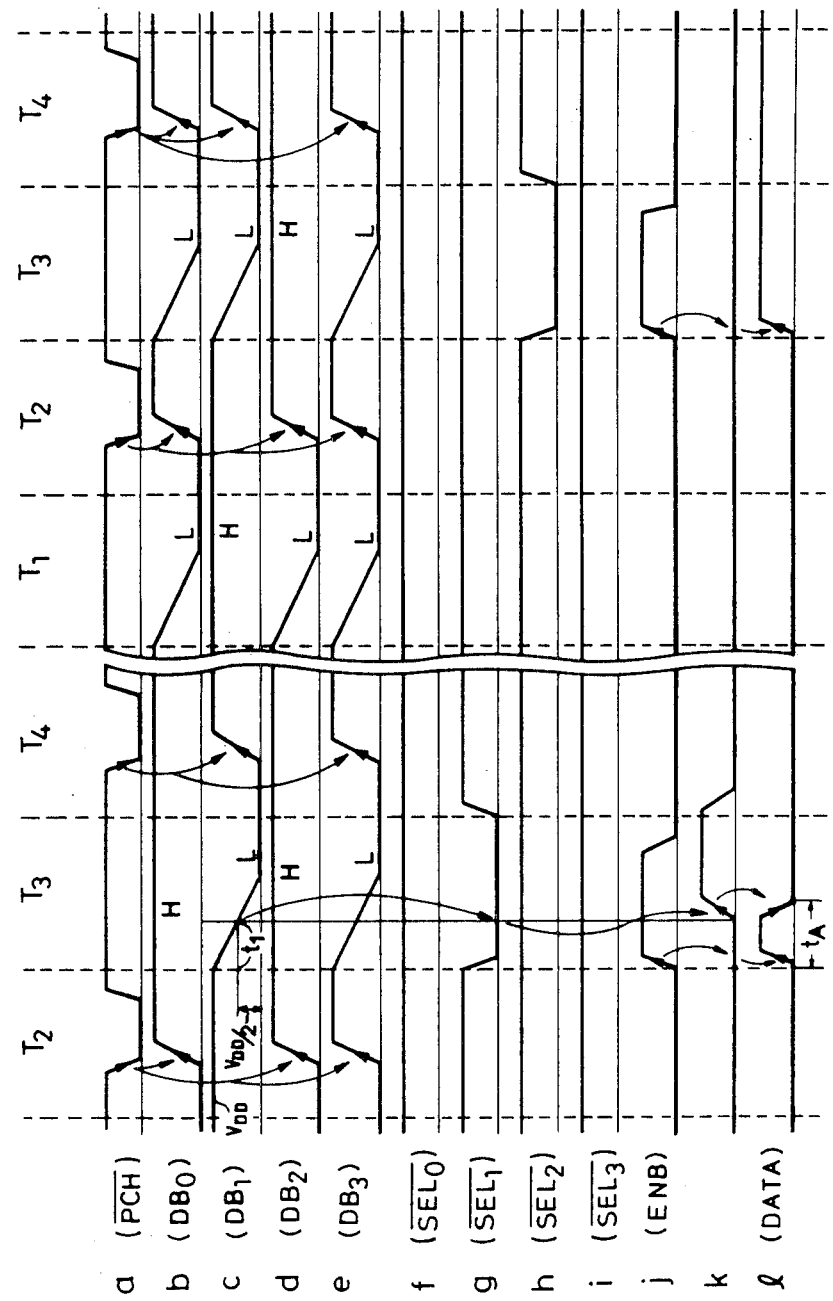
FIG. 2 is the time chart showing waveforms of various parts of FIG. 1.

(1) Data read-in speed is very high:

In the conventional apparatus of FIG. 2, the read-in time $t_A$ for L-signal is sum of time of fall of data bus line signal c from the voltage $V_{DD}$ to the voltage $\frac{1}{2}V_{DD}$ and the propagation delay time in the complex gate 13 and the data latch B. On the contrary in the embodiment of FIG. 4, the read-in time $t_B$ of the signal c is the sum of the time of fall of data bus signal c from the voltage $V_{DD}$ to the voltage $(V_{DD}-V_{TP})$ and the resetting time in which one of the series connections of two p channel MOS transistors resets the flip-flop circuit consisting of the first inverter 30 and the second inverter consisting of the two transistors 39 and 41. Accordingly, assuming that the former times in both the prior art and the present invention are dominant, the former times are compared in detail. Provided that the power source voltage $V_{DD}$ is 5 V and threshold voltage $V_{TP}$ of the p channel MOS transistor is 0.8 V and the data bus signal falls from the voltage $V_{DD}$ to ground (0 V) in 100 ns, then the read-in time of the prior apparatus is $t_A \simeq 50$ ns and read-in time $t_B$ of the present invention $t_B \simeq 16$ ns. That is, the read-in time $t_B$ of the present invention is shorter to $\frac{1}{3}$ or less of the reading in time of the conventional apparatus of FIG. 1 and FIG. 2.

Nextly, read-in times for H-signal is compared. In the conventional apparatus of FIG. 1 and FIG. 2, one of the selection signal $\overline{SEL}_0$, $\overline{SEL}_1$, $\overline{SEL}_2$ and $\overline{SEL}_3$ changes to L-level and enable signal ENB changes to H-level only after entering into phase $T_3$ of the second kind cycle, and furthermore only after lapsing of a propagation delay time of the complex gate 13 and data latch B, the output to the external output terminal DATA changes to H. On the contrary, in case of the apparatus of the present invention of FIG. 3 and FIG. 4, the preset is performed during the phase $T_2$ of the second kind of cycle of the right hand of the waveform r of FIG. 4, and the output signal has been already in H state at the time before entering the phase $T_3$. Therefore, according to the present invention, for instance, by appropriately designing the inverter 30, it is possible to design the circuit configuration such that read-in speed of L-signal only is high and further advantage is realized.

(2) Input capacitance is small:

In the MOS transistor circuit of FIG. 3 and FIG. 5, input capacitances of the data bus lines $DB_0$, $DB_1$, $DB_2$ and $DB_3$, and the selection signal lines $\overline{SEL}_0$, $\overline{SEL}_1$, $\overline{SEL}_2$ and $\overline{SEL}_3$ are the gate capacitance of a respective one p channel transistor, and hence, reasonably small.

On the contrary, in the conventional circuit of FIG. 1 the input capacitance is given as the total of the gate input capacitances of n channel transistor and p channel transistor of the complex gate 13. Therefore, the input capacitance of the apparatus of the present invention is only half or a third of that of the conventional apparatus. Since the input capacitance is very small, in the apparatus in accordance with the present invention. the signal propagation speed of the data bus and control signal line can be increased two or three times (3) Number of transistors is small:

The number of MOS transistors to constitute the circuit part C of FIG. 3 and FIG. 5 is only 13: and in general, when number of input data to be selected is N, the circuit part C can be constituted with 2n+5 MOS transistors. On the contrary, the circuit part A of the conventional apparatus of FIG. 1 requires 28 MOS transistors, and in general requires 4n+12 MOS transistors for the number of input data n. Therefore, according to embodiments of FIG. 3 and FIG. 5 of the present invention, transistors required for the circuit part C is only less than half of the conventional one. Therefore, the apparatus is very suitable for realizing on an IC or LSI.

(4) Adaptability for large number of input data:

The embodiments of FIG. 3 and FIG. 5 can be modified to adapt for larger number of input data without any theoretical limit. On the contrary, in the conventional apparatus of FIG. 1, the complex gate 13 can handle up to only 4 input data in actual use, and there is no possibility of realizing the apparatus adaptable for accepting 8 input data for 16 input data.

What is claimed is:

1. A multiple input MOS register comprising:
a plurality of series connections, each including a first MOS transistor of a first conductivity type and a second MOS transistor of said first conductivity type coupled in series with each other by connecting a drain of said first MOS transistor to a source of said second MOS transistor, a source of said first MOS transistor being connected to a first constant voltage point and a drain of said second MOS transistor being connected to a common connection point, a gate of each said first MOS transistor being connected to a respective selection signal input and a gate of each said second MOS transistor being connected to a respective data input terminal so that said selection signal inputs and data inputs are connected in parallel to respective series connections;
a third MOS transistor of a second conductivity type having a drain which is coupled to said common connection point, a source which is coupled to a second constant voltage point and a gate which is coupled to a preset signal line;
a first inverter having an input terminal connected to said common-connection point and an output terminal connected to an external output terminal; and
a second inverter having an input terminal connected to said output terminal of said first inverter and having an output terminal connected to said input terminal of said first inverter.

2. A MOS register in accordance with claim 1, wherein said first conductivity type is p-conductivity type and said second conductivity type is n-conductivity type.

3. A MOS register in accordance with claim 2, wherein
said second inverter comprises a fourth, p-conductivity type MOS transistor and a fifth n-conductivity type MOS transistor having drains which are common-connected as an output terminal, said output terminal being connected to said common-connection point, the source of said fourth MOS tansistor being connected to said first constant voltage point, the source of said fifth MOS transistor being connected to said second constant voltage point, and the gates of both of the fourth and fifth MOS transistors being connected in common as an input terminal.

4. A MOS transistor circuit in accordance with claim 3, wherein
when both of said fourth MOS transistor and said third MOS transistor are in an ON state in which conduction between respective source and drain is possible, at the same time, a voltage at said common-connection point is lower than a circuit threshold voltage of said first inverter, and
when either one of said series connections and said a fifth MOS transistor are in said ON state at the same time, a voltage at said common-connection point is higher than said circuit threshold voltage of said first inverter.

5. A MOS transistor circuit in accordance with claim 1, wherein said first conductivity type is n-conductivity type and said second conductivity type is p-conductivity type.

6. A MOS transistor circuit in accordance with claim 5, wherein
said second inverter comprises a fourth, p-conductivity type MOS transistor and a fifth n-conductivity type MOS transistor having drains which are common-connected as an output terminal which is connected to said common-connection point, the source of said fourth MOS transistor being connected to said first constant voltage point, the source of said fifth MOS transistor being connected to said second constant voltage point, and the gates of both of said fourth and fifth MOS transistors being connected in common as an input terminal.

7. A MOS transistor circuit in accordance with claim 6, wherein
when both of said fifth MOS transistor and said third MOS transistor are in an ON state in which conduction between drain and source is possible, at the same time, a voltage at said common-connection point is higher than a circuit threshold voltage of said first inverter, and
when either one of said series connections and said fourth MOS transistor are both in said ON state at the same time, a voltage at said common-connection point is lower than said circuit threshold voltage of said first inverter.

* * * * *